(12) United States Patent
Ober et al.

(10) Patent No.: US 6,379,874 B1
(45) Date of Patent: Apr. 30, 2002

(54) USING BLOCK COPOLYMERS AS SUPERCRITICAL FLUID DEVELOPABLE PHOTORESISTS

(75) Inventors: Christopher K. Ober, Ithaca; Jianguo Wang, Horseheads, both of NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 09/688,126

(22) Filed: Oct. 16, 2000

Related U.S. Application Data

(60) Provisional application No. 60/161,346, filed on Oct. 26, 1999.

(51) Int. Cl.$^7$ ................................................. G03F 7/00
(52) U.S. Cl. ..................................... 430/322; 430/270.1
(58) Field of Search ................................ 430/311, 322, 430/329, 270.1

(56) References Cited

U.S. PATENT DOCUMENTS

| | | | |
|---|---|---|---|
| 4,224,399 A | 9/1980 | Merrill et al. ............ | 430/282.1 |
| 4,369,246 A | 1/1983 | Chen et al. ................. | 430/306 |
| 4,944,837 A | 7/1990 | Nishikawa et al. ........... | 216/41 |
| 5,412,027 A | 5/1995 | Shine et al. .................. | 525/63 |
| 5,422,377 A | 6/1995 | Auhert ........................ | 521/64 |
| 5,567,769 A | 10/1996 | Shine et al. .................. | 525/63 |
| 5,665,527 A | 9/1997 | Allen et al. .................. | 430/325 |
| 5,670,614 A | 9/1997 | Roby et al. .................. | 528/480 |
| 5,786,131 A | 7/1998 | Allen et al. .................. | 430/325 |

OTHER PUBLICATIONS

Gabor, A. H. and Ober, C. K., in Microelectronics Technology: Polymers for Advanced imaging and Packaging; Reichmans, E., Ober, C. K., etc., Eds., ACS Symposium Series 614, American Chemical Society, Washington, DC, 281–298 (1995).

Ober, C. K., et al., Adv. Mater. 9, No. 13, 1039–1043 (1997).

Sundararajan, N., et al., Proc. ACS Div. Polym. Mater.: Sci. & Eng. 79, 130–131 (8/98).

Yang, S., et al., "Low–Surface—Energy Fluoromethacrylate Block Copolymers with Patternable Elements," Chem. Mater. 12, 33–40 (2000).

Sundararajan, N., et al., Supercritical $CO_2$ Processing for Submicron Imaging of Fluoropolymers, Chem. Mater. 12, 41–48 (2000).

*Primary Examiner*—Kathleen Duda

(57) ABSTRACT

Block copolymers containing block having pendant fluoro-containing groups and block having pendant hydrolyzable ester containing groups is developed at lower pressures and temperatures than random copolymers of the same monomers. Where the block with ester groups is from polymerization of 2-tetrahydropyranyl methacrylate and the block with pendant fluoro-containing groups is from polymerization of perfluoroalkyl methacrylate or semifluorinated alkyl methacrylate, resolution of sub 0.3 $\mu$m features is enabled.

7 Claims, No Drawings

USING BLOCK COPOLYMERS AS SUPERCRITICAL FLUID DEVELOPABLE PHOTORESISTS

CROSS-REFERENCE TO RELATED APPLICATION

This application claims the benefit of U.S. Provisional Application No. 60/161,346, filed Oct. 26, 1999, the whole of which is incorporated herein by reference.

TECHNICAL FIELD

This invention is directed to generating negative tone resist images in a lithographic process for use, for example, in the manufacture of microelectronics.

BACKGROUND OF THE INVENTION

A lithographic process used to pattern integrated circuits and other microelectronics is as follows: A polymeric material is spun onto a substrate such as a silicon wafer to form a uniform coating. Then, the polymer is exposed to a source of photons, electrons, or X-rays through a mask based on the pattern information to be transferred. The mask allows the radiation to pass through previously selected areas. The polymer exposed to radiation undergoes a chemical change (e.g., cross-linking, chain-scission, or polarity change). The next step is the use of a solvent to selectively remove the exposed or the unexposed regions to transfer the pattern onto the polymer layer. The use of the solvent is called development, and the solvent is called a developer. The polymer is called a positive-tone resist if the exposed regions become more soluble in the solvent, and the polymer is called a negative-tone resist if the exposed regions become less soluble in the solvent.

The trend in the electronics industry towards miniaturization and increased complexity has set up a need for decrease in resolvable feature size. This has been achieved by decreasing the wavelength of the exposing radiation but for further diminished feature size, the selectivity of the solvent becomes increasingly important. However, the use of liquid developers in the mainstream production environment generates enormous amounts of waste, causing great environmental concern. In view of this, supercritical fluids have been considered for use as environmentally friendly, nontoxic, nonflammable and very low cost lithographic developers.

Allen et al. U.S. Pat. No. 5,665,527 is directed to generating a negative tone resist image in a process comprising the steps of (1) coating a substrate with a film of a polymeric composition comprising a polymer, a photosensitive acid generator and acid labile groups; imagewise exposing the film to generate free acid; and developing the image with critical fluid. In the sole working example, the polymer is a 75/25 (mole percent) random copolymer of pentafluoropropyl methacrylate and t-butyl methacrylate and the critical fluid developer is carbon dioxide critical fluid. This process does not enable resolution of sub 0.3 µm features.

SUMMARY OF THE INVENTION

It has been discovered that block copolymers allow development at lower pressures and temperatures to entirely dissolve the unexposed regions to form a negative tone resist image than where random copolymer with the same volume percentages of the same monomers is used.

Moreover, it has been discovered in a preferred embodiment of the invention that block copolymers with acid cleavable tetrahydropyranyl groups and supercritical $CO_2$ soluble fluoro side-chain containing methacrylate groups chemically amplified to effect the polarity change leading to the solubility change in supercritical $CO_2$ enables sub 0.3 µm features to be resolved.

The invention herein is directed to a process for generating a negative tone resist image, comprising the steps of:
  (a) coating a substrate with a film comprising block copolymer comprising: (i) block having pendant fluoro-containing groups and (ii) block having pendant hydrolyzable ester containing groups, the volume percent of block (i) being great enough to provide complete solubility in regions of the film to be removed in step (c) but not so great that sub 0.3 µm features cannot be resolved in step (c);
  (b) hydrolyzing hydrolyzable ester to polar functionality insoluble in the supercritical fluid used in step (c) to form a pattern defined by supercritical fluid soluble and supercritical fluid insoluble regions of the film; and
  (c) developing a negative tone resist image from the pattern by using supercritical fluid to dissolve the supercritical fluid soluble regions of the film.

The block copolymer has a weight average molecular weight, for example, ranging from 2,000 to 20,000.

Typically, the supercritical fluid is supercritical $CO_2$ (which is selective to polarity changes).

In the preferred embodiment referred to above, the blocks (ii) are formed by polymerizing 2-tetrahydropyranyl methacrylate and the blocks (i) are formed by polymerizing fluorinated alkyl methacrylate. In an embodiment herein, the block copolymer contains more than 50% by volume blocks (i). In an embodiment herein, the block copolymer contains at least 20% by volume blocks (ii). Working examples are presented hereinafter wherein the blocks (i) are formed by polymerizing 1H, 1H-perfluoro-n-butyl methacrylate (Example I) and by polymerizing 1H, 1H-perfluorooctyl methacrylate (Examples II and III).

The molecular weights herein including weight average molecular weights $M_w$, number average molecular weights $M_n$ and polydispersities $M_w/M_n$ are determined by gel permeation chromatography using poly(methyl methacrylate) standards.

The volume percentages of the block copolymers are calculated from $^1$HNMR by comparing the integrated area of the methine proton in the tetrahydropyranyl methacrylate or of the methylene protons in the tetrahydropyranyl methacrylate ring to the integrated area of the methylene protons in the fluorinated alkyl methacrylate.

The term "supercritical fluid" is used herein to mean substance heated to a temperature above its critical temperature and compressed to a pressure above its critical pressure to achieve miscibility without phase separation. For a supercritical fluid consisting of one substance, there is miscibility between the liquid and gas phase of such substance. For critical fluids consisting of two or more substances, there is miscibility between the two liquids and the two gases of such substances.

DETAILED DESCRIPTION

As indicated above, the invention is directed to a process for generating a negative tone resist image comprising the steps of: (a) coating a substrate with a film comprising block copolymer comprising: (i) block having pendant fluoro-containing groups and (ii) block having pendant hydrolyzable ester containing groups (i.e., which are hydrolyzable to supercritical fluid insoluble functionality in step (b)), the volume percent of block (i) being great enough to provide complete solubility in regions of the film to be removed in step (c) at pressures less than 7,000 psi and temperature less than 80° C. in step (c), but not so great that sub 0.3 μm features cannot be resolved in step (c); (b) hydrolyzing hydrolyzable ester to polar functionality insoluble in the supercritical fluid used in step (c) to form a pattern defined by supercritical fluid soluble and supercritical fluid insoluble regions of the film; and (c) developing a negative tone image resist from the pattern by using supercritical fluids to dissolve the supercritical fluid soluble regions of the film. The block copolymer has, for example, a weight average molecular weight ranging from 2,000 to 20,000, for example, 4,000 to 15,000, for example, 4,500 to 12,000, a number average molecular weight ranging from 1,500 to 18,000, for example, from 4,000 to 12,000 and a polydispersity ranging, for example, from 1.05 to 1.20. Suitable substances for use as the supercritical fluid include carbon dioxide, ammonia, difluorodichloromethane, methane, ethane and propane; other suitable substances will be known to those skilled ill the art.

We turn now to the preferred case where the block (ii) is formed by polymerizing 2-tetrahydropyranyl methacrylate and the block (i) is formed by polymerizing fluorinated alkyl methacrylate. For this preferred case, the supercritical fluid is preferably supercritical $CO_2$.

The polymers for this preferred case have, for example, the structure

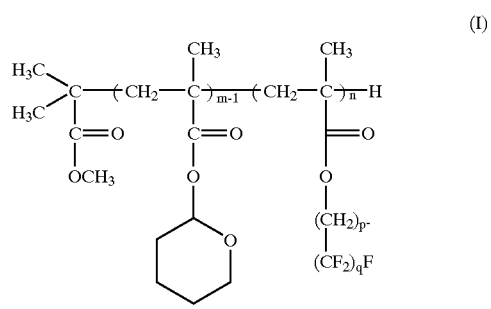

(I)

where the molecular weight ranges are as set forth above in the general case and p is 1 to 6, preferably 1, and q is 1 to 12, preferably 3 to 7, and n and m−1 are such as to provide said molecular weight and a volume percent of more than 50% of blocks (i) and a volume percent of at least 20% of blocks (ii). When p is 1 and q is 3, a volume percent of at least 51% of blocks (i) provides complete dissolution of region which is not insolubilized in step (b) at pressures as low as 4,500 psi at a temperature of 45° C. and in the development step. When p is 1 and q is 7, a volume percent at least 54% of blocks (i) provides complete dissolution of region which is not insolubilized in step (b) at pressures of 6,500 psi at 75° C. in the development step.

The block polymers of the structure (I) are readily synthesized by group transfer polymerization with appropriate catalysts as described below.

A reaction scheme, where 2-tetrahydropyranyl methacrylate (THPMA) is polymerized first, is set forth below where m−1 (defining m) and n and p and q are as defined above, and TBA means tetrabutylammonium, THF means tetrahydrofuran, RT means room temperature, and THP means tetrahydropyranyl.

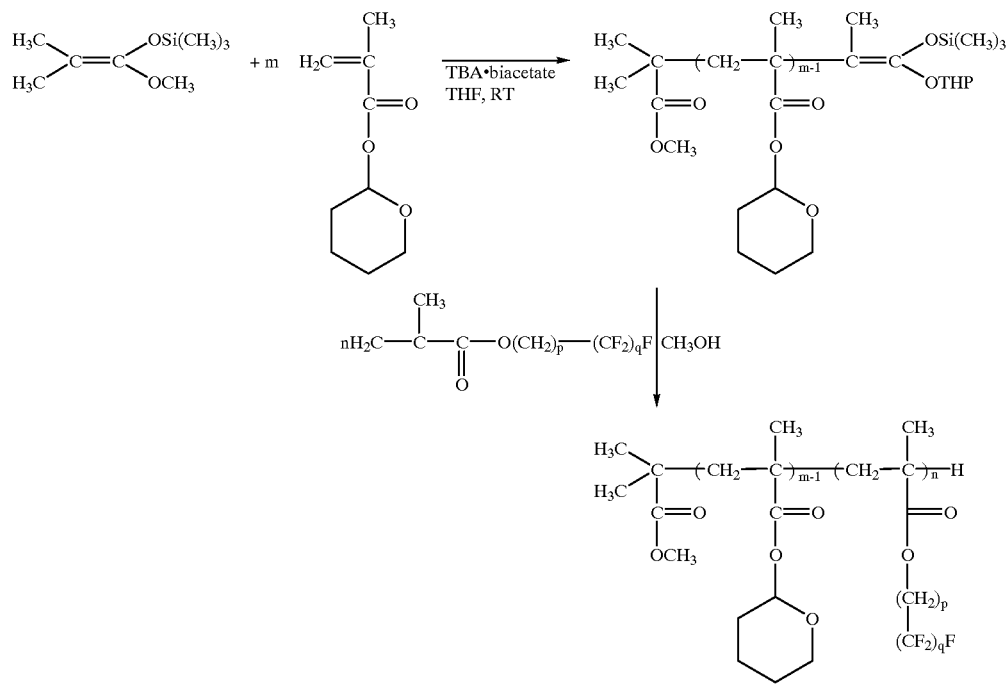

We turn now to the polymerization of the THPMA. This is readily carried out without heating in tetrahydrofuran using [(1-methoxy-2-methyl-1-propenyl)oxy] trimethylsilane, MDTA, available from Aldrich, e.g., at a molar ratio of TMPMA to MDTA ranging from 0.5:1 to 50:1, as an initiator and tetrabutylammonium (TBA) biacetate, prepared, for example, as described in Patrickios, C. S., et al., Macromolecules, 27, 930–937 (1994) as catalyst. The TBA biacetate is readily added as a 0.04 M solution in tetrahydrofuran, for example, in a molar ratio of THPMA to TBA biacetate ranging from 10,000:1 to 50,000:1, e.g., 25,000:1 or 22,000:1; a small amount of water (e.g., 6 molar equivalents) can be added to facilitate dissolution.

We turn now to the synthesis of the block copolymer. This is readily carried out by adding fluoralkyl methacrylate monomer, e.g., perfluoroalkyl methacrylate or semifluorinated alkyl methacrylate to the living poly-THPMA solution. Reaction is allowed to occur and block copolymer is precipitated with methanol and/or hexanes and is separated, e.g., by filtration and dried.

When 1H, 1H-perfluoro-n-butyl methacrylate is used, $M_w$ ranging, for example, from 4,500 to 9,000 and polydispersities, for example, ranging from 1.11 to 1.17, are obtained. Where 1H, 1H-perfluorooctyl methacrylate is used, $M_w$ ranging, for example, from 5,500 to 10,000 and polydispersities ranging, for example, from 1.07 to 1.10, are obtained.

We turn now to the use of block copolymer of the structure (I) to generate negative tone resist images, e.g., for microelectronic circuits, for example, integrated circuits.

In the first step, a substrate is coated with composition comprising the block copolymer. Suitable substrates include those known in the art including those constituted of silicon, ceramics and polymer. Silicon wafer substrates are preferably pretreated by either vapor-priming with hexamethyl disilazane (HMDS) at 120° C. for 25 second or coating with antireflective coating and then baking at 120° C. for 25 seconds. The block copolymer is dissolved in a casting solvent, preferably in propylene glycol methyl ether acetate (PGMEA) in an amount of 15–20 weight percent of polymer by weight of solution. Supercritical fluid soluble photosensitive acid generator (PAG) is added as needed to mediate the hydrolysis of step (b). The PAGs include triflates (e.g., bis-(t-butylphenyl)iodonium triflate) and others as disclosed in U.S. Pat. No. 5,665,527, the disclosure of which is incorporated by reference; e.g., in an amount of 1 to 2% by weight of the copolymer concentration in the solution. The solutions are then preferably filtered using 0.2 or 0.45 $\mu$m PTFE filters. Approximately 2 ml of solution is dispensed onto an 8" wafer to form a uniform film on the wafer. The wafers with film thereon are spun to obtain thin films, e.g., of 0.2 to 0.5 $\mu$m or even 1 $\mu$m. The approximate range of speeds for this is 1,000 to 3,000 rpm.

The coated substrates are preferably baked at 120 to 150° C., e.g., for 1 minute at 120° C., to evaporate the remaining solvent in the film and stabilize the coating (i.e., prevents flow thereof).

Hydrolysis is then caused to occur to cleave the tetrahydropyranyl group and form supercritical $CO_2$ insoluble acid groups in the blocks (ii). This is preferably carried out by exposure of the virgin copolymer (i.e., before exposure to radiation) to deep ultraviolet radiation at a wavelength of about 190–250 nm. The combination of PAG and radiation generates protons to cleave the ester group and form supercritical $CO_2$ insoluble acid group. Exposures are preferably made using a KrF laser operating at 248.4 nm wavelength or an nmArF excimer laser operating at a 193 nm wavelength.

Typical dose matrices range from 1 $mJ/cm^2$ to 60 $mJ/cm^2$. The dose necessary to render the block copolymer insoluble was found to be 10 $mJ/cm^2$ at a post-application bake of 120° C. for 60 seconds and a post-exposure bake of 120° C. for 60 seconds. When the post-exposure bake was decreased to 90° C., the dose necessary for insolubility was greater than 50 $mJ/cm^2$. Polar photosensitive acid generators such as bis-(t-butylphenyl)iodonium triflate were found to allow lower doses of radiation (e.g., 4 $mJ/cm^2$) for insolubility than non-polar photosensitive acid generators. As indicated above, a mask is used to screen those regions where insolubility is not desired to form a pattern and mediate the depressions in the negative tone resist image which is generated.

A post-exposure bake is preferably carried out, for example, at 80 to 150° C. for 0.5 to 5 minutes, e.g., at 120° C. or 90° C. for 60 seconds. As indicated above, this decreases the radiation exposure dose necessary to obtain insolubility.

We turn now to the supercritical $CO_2$ developing.

The supercritical $CO_2$ developing is preferably carried out in an extraction vessel reinforced to withstand the pressures used in the developing. Developing is preferably carried out as follows. The coated substrates to be developed are inserted in the vessel. Carbon dioxide (e.g., SFC grade with helium head pressure of 1,500 psi, 99.9% pure) is flowed through the extraction vessel over the film coatings on the coated substrates at temperatures ranging from 30 to less than 80° C., e.g., 30 to 70° C., and pressures ranging from 2,000 to less than 7,000 psi, e.g., 2,500 to 6,500 psi, e.g., below 4,500 psi, at a flow rate of about 2 to 4 liters per minute for each 50 ml of internal volume. As the $CO_2$ passes through the extraction vessel, it dissolves the supercritical $CO_2$ soluble regions of the film coating on the substrate. Preferably, after the gas with block copolymer dissolved therein leaves the extraction vessel, it is flowed through a pressure reduction valve maintained at a slightly higher temperature than the vessel to prevent clogging of the valve by condensation as the gas expands and is then routed to a collection vessel where dissolved copolymer precipitates out and the $CO_2$ with copolymer removed therefrom can be compressed and recycled for reuse.

The process enables resolution of features less than 0.3 $\mu$m in size, e.g., features 0.2 $\mu$m in size.

Due to the low interfacial energy of the tetrahydropyranyl methacrylate component in the block copolymer, it tends to segregate down to the interface of the substrate and film coating. After exposure to radiation, the tetrahydropyranyl methacrylate moiety of the block copolymer is converted to polar methacrylic acid. Hence, a polar methacrylic acid layer is generated. This is considered to greatly improve adhesion because the nonpolar supercritical $CO_2$ developer is not able to penetrate the interface between the film and the substrate thereby providing good contrast and fabrication of smaller features than heretofore obtained using supercritical $CO_2$ development. The excellent anchoring and prevention of penetration of supercritical $CO_2$ at the film substrate interface is considered to result in the increase in resolution compared to what has been obtained before.

Elements of the invention are described in Appendix A (a four-page patent disclosure), Appendix B (a manuscript titled "Supercritical $CO_2$ Processing for Sub-micron Imaging of Fluoropolymers"), and Appendix C (Sundararjan, N., et al., Proc. ACS Div. Polym. Mat.: Sci. & Eng. 1998, 79, pp 130–131) which form part of Provisional Patent Application No. 60/161,346 which is incorporated herein by reference. The manuscript of Appendix B has matured into Sundararajan, N., et al., Chem. Mater. 12, 41–48 (2000)).

The invention is illustrated by the following Examples, and advantages are indicated by comparison of results in the Examples to results in the following Comparative Examples.

EXAMPLE I

Synthesis of Compound of the Formula (I) Where p is 1 and q is 3, and (m−1) and n are Such that the Volume Percent of Ester Component is 49% and of Fluorocomponent is 51% (Polymer F3-6) and Lithographic Processing Thereof After distilling 8 ml of tetrahydrofuran into a reactor, 67 $\mu$l (0.33 mmol) of methyl trimethylsilyl dimethylketene acetal initiator (obtained from Aldrich, denoted MTDA) and 8.3 $\mu$l (0.34×10$^{-3}$ mmol) of tetrabutylammonium biacetate solution (the biacetate was dissolved in freshly distilled tetrahydrofuran to give a 0.04 M solution and 6 molar equivalents of water were added) were added. After 5 minutes, 1.35 ml (8.32 mmol) of 2-tetrahydropyranyl methacrylate (THPMA) was added over a period of about 3 minutes. The temperature of the solution rose from 22.5° C. to 40.0° C. With 30 minutes stirring, temperature was cooled back to room temperature. After the mixture was stirred for an additional 30 minutes, 1.35 ml (7.05 mmol) of 1H, 1H-perfluorobutyl methacrylate (Lancaster), i.e., heptafluorobutyl methacrylate, was added all at once. The temperature did not change over about 2 minutes and then suddenly increased and reached a maximum of approximately 41.0° C. in 1 minute. A milky solution was observed in the initial 2 or 3 seconds during the temperature rise. The reaction was quenched with about 1 ml of methanol, and poured into 200 ml of methanol after stirring for 2 hours. After filtration and washing with hexanes, the polymer was air-dried at room temperature and then dried 12 hours in a vacuum oven. 2.7 Grams of block copolymer was obtained with a yield of about 82%.

The copolymer contained 49 volume percent of ester component and 51 volume percent of fluorocomponent and had a weight average molecular weight $M_w/10^3$ of 8.96, a number average molecular weight $M_n/10^3$ of 7.89 and a polydispenising $M_w/M_n$ of 1.14.

Copolymer solution for spincasting is prepared by dissolving 15 weight percent of copolymer in propylene glycol methyl ether acetate and adding bis-(t-butylphenyl) iodonium triflate photosensitive acid generator in an amount of 1 weight percent of the polymer concentration in the solution. The solution is then filtered using a 0.45 $\mu$m PTFE filter. Spincasting is carried out on 8" silicon wafers that are pretreated by coating with DUV 18L anti-reflective coating. The copolymer solution is dispensed manually using an Eppendorf pipette. Approximately 2 ml of solution is dispensed onto each silicon wafer to form a uniform film. The wafers are spun at 1,000–2,000 rpm to obtain a film thickness of 0.2 $\mu$m. The samples are then baked at 120° C. for 60 seconds. The baked film is exposed through a mask which has patterned information having features ranging from 1 $\mu$m to sub 0.1 $\mu$m to be transferred, using a ArF laser operating at 193 nm wavelength with an exposure dosage of 10 mJ/cm$^2$. The film is then baked at 120° C. for 60 seconds. The exposed wafers are developed using supercritical $CO_2$ at a pressure of 4,500 psi at 45° C. for 2 minutes. The unexposed portion of the film is completely dissolved and the exposed portion is insoluble, thereby forming a negative tone image. Features as small as 0.2 $\mu$m are resolved.

Comparative Example 1

An experiment is carried out as in Example I except that the block copolymer is synthesized to contain 54 volume percent ester component and 46 volume percent fluorocomponent. The unexposed portion of the film is not completely dissolved even when supercritical $CO_2$ is used at a pressure of 6,500 psi at 80° C. for 30 minutes.

EXAMPLE II

Synthesis of Compound of the Formula (I) Where p is 1 and q is 7, and (m−1) and n are Such that the Volume Percent of Ester Component is 46% and of Fluorocomponent is 54% (Polymer F7-3) and Lithographic Processing Thereof After distilling of 10 ml of tetrahydrofuran into a reactor, 56 $\mu$l (9.34 mmol) of MTDA and 10.4 $\mu$l of tetrabutylammonium biacetate solution (the biacetate was dissolved in freshly distilled tetrahydropyran to give a 0.04 M solution and 6 molar equivalents of water were added) were added. After 5 minutes, 1.5 ml (9.34 mmol) of THPMA was added over a period of 3 minutes. The temperature rose from 22.5° C. to 38.6° C. With 30 minutes stirring, 1.5 ml (4.49 mmol) of predistilled 1H, 1H-perfluorooctyl methacrylate (Lancaster), i.e., pentadecafluorooctyl methacrylate, was added to the living poly-THPMA solution. The temperature of the solution increased up to 28° C. within 1 minute, and the solution was left stirring for another 2 hours. The color of the solution changed to light blue and with time to pale yellow. The viscosity of the solution also seemed to change during the polymerization. The mixture was stirred for another 5 hours, and the polymer was then precipitated into 250 ml of methanol. The solid block polymer was filtered after 2 hours of stirring and dried under vacuum at room temperature overnight.

The yield of block copolymer was 89%. It contained 46 volume percent of ester component and 54 volume percent of fluorocomponent and had a weight average molecular weight $M_w/10^3$ of 11.11. A number average molecular weight $M_n/10^3$ of 10.1, and a polydispersity $M_w/M_n$ of 1.1.

Copolymer solution for spincasting is prepared by dissolving 15 weight percent of copolymer in propylene glycol methyl ether acetate and adding bis-(t-butylphenyl) iodonium triflate photosensitive acid generator in an amount of 1 weight percent of the polymer concentration in the solution. The solution is then filtered using a 0.45 $\mu$m PTFE filter. Spincasting is carried out on 8" silicon wafers that are pretreated by coating with DUV 18L antireflective coating. The copolymer solution is dispensed manually using an Eppendorf pipette. Approximately 2 ml of solution is dispensed onto each silicon wafer to form a uniform film. The wafers are spun at 1,000–2,000 rpm to obtain a film thickness of 0.2 $\mu$m. The film is then baked at 120° C. for 60 seconds. The baked film is exposed through a mask which has patterned information having features ranging from 1 $\mu$m to sub 0.1 $\mu$m to be transferred, using a ArF laser operating at 193 nm wavelength with an exposure dosage of 4 mJ/cm$^2$. The film is then baked at 120° C. for 60 seconds. The exposed wafer is developed using supercritical $CO_2$ at a pressure of 6,500 psi at 75° C. The unexposed portion of the film is completely dissolved and the exposed portion is insoluble thereby forming a negative tone image. Features as small as 0.2 $\mu$m are resolved.

Comparative Example 2

An experiment was carried out as in Example II except that the copolymer is synthesized to contain 50 volume percent ester component and 50 volume percent fluorocomponent. The unexposed portion of the film is insoluble when supercritical $CO_2$ is used at a pressure of 6,500 psi at 75° C.

EXAMPLE III

Synthesis of Compound of the Formula (I) Where p is 1 and q is 7, and (m−1) and n are Such that the Volume Percent of Ester Component is 34% and the Volume Percent of Fluorocomponent is 66% (Polymer F7-6) and Lithographic Processing Thereof An experiment is carried out as in Example II except that the block copolymer obtained contained 34 volume percent ester component and 66 volume percent fluorocomponent. Variations from the synthesis procedure of Example II were as follows. The volume ratio of THPMA feed to 1H,1H-perfluorooctyl methacrylate feed was 34:66. The block copolymer product had a weight average molecular weight $M_w/10^3$ of 9.54 and a number average molecular weight $M_n/10^3$ of 8.95 and a polydispersity $M_w/N_n$ of 1.07.

Copolymer solution for spincasting is prepared by dissolving 15 weight percent of copolymer in propylene glycol methyl ether acetate and adding bis-(t-butylphenyl) iodonium triflate photosensitive acid generator in an amount of 1 weight percent of the polymer concentration in the solution. The solution is then filtered using 1 $\mu$m PTFE filter. Spincasting is carried out on 8" silicon wafers that are pretreated by coating with DUV 18L antireflective coating. The copolymer solution is dispensed manually using an Eppendorf pipette. Approximately 2 ml of solution is dispensed onto each silicon wafer to form a uniform film. The wafers are spun at 1,000–2,000 rpm to obtain a film of thickness of 0.2 $\mu$m. The samples are then baked at 120° C. for 60 seconds. The baked film is exposed through a mask which has patterned information having features ranging from 1 $\mu$m to sub 0.1 $\mu$m to be transferred, using ArF laser operating at 193 nm wavelength with an exposure dosage of 4 mJ/cm². The film is then baked at 120° C. for 60 seconds. The exposed wafer is developed using supercritical $CO_2$ at a pressure of 4,000 psi at 40C. The unexposed portion of the film is completely dissolved and the exposed portion is insoluble, thereby forming a negative tone image. Features as small as 0.2 $\mu$m are resolved.

Comparative Example 3

An experiment is carried out as in Example III except that the copolymer utilized is not a block copolymer but rather a random copolymer from monomers 2-tetrahydropyranyl methacrylate (THPMA) and 1H, 1H-perfluorooctyl methacrylate (F7MA) (Lancaster). Both monomers were added simultaneously into the reaction chamber using two different syringes. Polymerization was continued for 6 hours and a milky solution was obtained. Copolymer is recovered from the milky solution by precipitation using methanol. The random copolymer obtained contained 34 volume percent THPMA and 66% volume percent F7MA.

The random copolymer did not dissolve in supercritical $CO_2$ at 6,000 psi and 60° C., that is, at much higher pressure and temperature conditions compared to the block copolymer with the same volume percentages of ester and fluorocomponents but in blocks.

VARIATIONS

Many variations of the above will be obvious to those skilled in the art. Thus, the invention is defined by the claims.

What is claimed is:

1. A process for generating a negative tone resist image, comprising the steps of:

(a) coating a substrate with a film comprising block copolymer comprising: (i) block having pendant fluoro-containing groups and (ii) block having pendant hydrolyzable ester containing groups, the volume percent of block (i) being great enough to provide complete solubility in regions of the film to be removed in step (c) but not so great that sub 0.3 $\mu$M features cannot be resolved in step (c) and ranging from more than 50% by volume to 60% by volume;

(b) hydrolyzing hydrolyzable ester to polar functionality insoluble in the supercritical fluid used in step (c) to form a pattern defined by supercritical fluid soluble and supercritical fluid insoluble regions of the film; and (c) developing a negative tone image resist from the pattern by using supercritical fluid to dissolve the supercritical fluid soluble regions of the film.

2. The process of claim 1 wherein the block copolymer has a weight average molecular weight ranging from 2,000 to 20,000.

3. The process of claim 2 wherein the supercritical fluid is supercritical $CO_2$.

4. The process of claim 3 wherein the block (ii) is formed by polymerizing 2-tetrahydropyranyl methacrylate and the block (i) is formed by polymerizing fluorinated alkyl methacrylate.

5. The process of claim 4 wherein the block (i) is formed by polymerizing 1H, 1H-perfluoro-n-butyl methacrylate.

6. The process of claim 4 wherein the block (i) is formed by polymerizing 1H, 1H-perfluorooctyl methacrylate.

7. A process for generating a negative tone resist image, comprising the steps of:

(a) coating a substrate with a film comprising block copolymer comprising: (i) block having pendant fluoro-containing groups and (ii) block having pendant hydrolyzable ester containing groups and (iii) hydrolysis mediating effective amount of triflate photosensitive acid generator, the volume percent of block (i) being great enough to provide complete solubility in regions of the film to be removed in step (c) but not so great that sub 0.3 $\mu$M features cannot be resolved in step (c);

(b) hydrolyzing hydrolyzable ester to polar functionality insoluble in the supercritical fluid used in step (c) to form a pattern defined by supercritical fluid soluble and supercritical fluid insoluble regions of the film; and (c) developing a negative tone image resist from the pattern by using supercritical fluid to dissolve the supercritical fluid soluble regions of the film.

* * * * *